(12) United States Patent
Roy et al.

(10) Patent No.: US 12,493,248 B2
(45) Date of Patent: Dec. 9, 2025

(54) METHOD FOR OPTIMIZING A SAMPLING SCHEME AND ASSOCIATED APPARATUSES

(71) Applicant: ASML NETHERLANDS B.V., Veldhoven (NL)

(72) Inventors: Sarathi Roy, Eindhoven (NL); Wolfgang Helmut Henke, Kempen (DE); Peter Ten Berge, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 582 days.

(21) Appl. No.: 17/922,925

(22) PCT Filed: Apr. 20, 2021

(86) PCT No.: PCT/EP2021/060157
§ 371 (c)(1),
(2) Date: Nov. 2, 2022

(87) PCT Pub. No.: WO2021/239334
PCT Pub. Date: Dec. 2, 2021

(65) Prior Publication Data
US 2023/0176490 A1 Jun. 8, 2023

(30) Foreign Application Priority Data
May 26, 2020 (EP) .................................... 20176435

(51) Int. Cl.
*G03F 7/00* (2006.01)
*G03F 9/00* (2006.01)
(52) U.S. Cl.
CPC ........ *G03F 7/70633* (2013.01); *G03F 7/7065* (2013.01); *G03F 9/7003* (2013.01)

(58) Field of Classification Search
CPC .. G03F 7/70633; G03F 7/7065; G03F 9/7003; G03F 7/70616; G03F 7/706833; H01L 22/20
(Continued)

(56) References Cited

U.S. PATENT DOCUMENTS 10,782,616 B2 * 9/2020 Wang .................. G03F 7/70508
11,635,698 B2 * 4/2023 Tel .......................... G03F 7/705
430/30
(Continued)

FOREIGN PATENT DOCUMENTS

EP            3579051           12/2019
TW          201940985           10/2019
(Continued)

OTHER PUBLICATIONS

International Search Report and Written Opinion dated Jul. 2, 2021, issued in corresponding PCT Patent Application No. PCT/EP2021/060157, pp. 1-13.
(Continued)

*Primary Examiner* — Caleen O Sullivan
(74) *Attorney, Agent, or Firm* — Pillsbury Winthrop Shaw Pittman, LLP (57) ABSTRACT

A method and associated apparatuses for optimizing a sampling scheme which defines sampling locations on a bonded substrate, having undergone a wafer to wafer bonding process. The method includes determining a sampling scheme for a metrology process and optimizing the sampling scheme with respect to a singularity defined by a large overlay error and/or grid deformation at a central location on the bonded substrate to obtain a modified sampling scheme.

20 Claims, 3 Drawing Sheets

(58) Field of Classification Search
USPC .......................................................... 430/30
See application file for complete search history.

(56) References Cited

U.S. PATENT DOCUMENTS

| | | | |
|---|---|---|---|
| 12,044,979 B2* | 7/2024 | Tel | .................. G03F 7/70633 |
| 2006/0033921 A1 | 2/2006 | Den Boef et al. | |
| 2006/0066855 A1 | 3/2006 | Boef et al. | |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2011/0065214 A1 | 3/2011 | Farooq et al. | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2012/0218533 A1 | 8/2012 | Lyulina et al. | |
| 2013/0258310 A1 | 10/2013 | Smilde et al. | |
| 2013/0271740 A1 | 10/2013 | Quintanilha | |
| 2018/0076037 A1 | 3/2018 | Kurz et al. | |
| 2018/0252998 A1 | 9/2018 | Ten Berge et al. | |
| 2020/0371441 A1* | 11/2020 | Tel | ...................... G03F 7/705 |

FOREIGN PATENT DOCUMENTS

| | | |
|---|---|---|
| WO | 2009/078708 | 6/2009 |
| WO | 2009/106279 | 9/2009 |
| WO | 2011/101187 | 8/2011 |
| WO | 2013/178422 | 12/2013 |
| WO | 2015/185166 | 12/2015 |
| WO | 2019/110261 | 6/2019 |
| WO | 2019/145092 | 8/2019 |
| WO | 2020/035272 | 2/2020 |

OTHER PUBLICATIONS

Office Action dated Mar. 30, 2022, issued in corresponding Taiwanese Patent Application No. 110117053, pp. 1-9.

Xie, L. et al., "Detection and Classification of Defect Patterns in Optical Inspection Using Support Vector Machines", Proceedings of 17th International Conference on Image Analysis and Processing, Naples, Italy, pp. 376-384 (Jul. 2013).

Huang, C.Y. et al., "Overlay Improvement By Zone Alignment Strategy", Proc. of SPIE, vol. 6922, pp. 69221G-69221G-8 (Jan. 2018).

Javazm, M. et al., "Observer Design for Topography Estimation in Atomic Force Microscopy Using Neural and Fuzzy Networks", Ultramicroscopy, vol. 214, pp. 1-17 (May 2020).

Sakanas, Aurimas et al., "Comparison of bonding-induced misalignment errors in InP-on-Si wafers determined by e-beam metrology: direct vs. adhesive bonding", arXiv:1808.06888v1, at arxiv.org/abs/1808.06888v1 (accessed on Nov. 2, 2022) (Aug. 21, 2018).

* cited by examiner

METHOD FOR OPTIMIZING A SAMPLING SCHEME AND ASSOCIATED APPARATUSES

This application is the U.S. national phase entry of PCT Patent Application No. PCT/EP2021/060157 which claims priority of European Patent Application No. 20176435.4 which was filed on May 26, 2020 and which is incorporated herein in its entirety by reference.

FIELD OF THE INVENTION

The present invention relates to methods and apparatus for applying patterns to substrates, and in particular to bonded substrates, in a lithographic manufacturing process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

Process control methods are used in the manufacture of integrated devices to monitor and control the processes of application of a pattern on a substrate or measurement of such a pattern. Such process control techniques are typically performed to obtain corrections for control of the process. Subsequently, it is sometimes required (for certain devices) to bond substrates together. Bonding processes include die-to-die, die-to-wafer and wafer-to-wafer. Wafer-to-wafer bonding, where whole wafers are permanently bonded together prior to dicing, has the potential of providing a high accuracy and high throughput bonding solution.

It would be desirable to improve process control methods in the manufacture of integrated devices.

SUMMARY OF THE INVENTION

In a first aspect of the invention, there is provided a method for optimizing a sampling scheme which defines sampling locations on a bonded substrate, having undergone a wafer to wafer bonding process, the method comprising: determining a sampling scheme for a metrology process; and optimizing the sampling scheme with respect to a singularity defined by a large overlay error and/or grid deformation at a central location on the bonded substrate to obtain a modified sampling scheme.

In a second aspect of the invention, there is provided a lithographic apparatus which is configured to provide product structures to a substrate in a lithographic process, said lithographic apparatus comprising a processor operable to optimize control of the lithographic apparatus during the lithographic process by performing the method of the first aspect.

In a third aspect of the invention, there is provided a computer program comprising program instructions operable to perform the method of the first aspect when run on a suitable apparatus.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
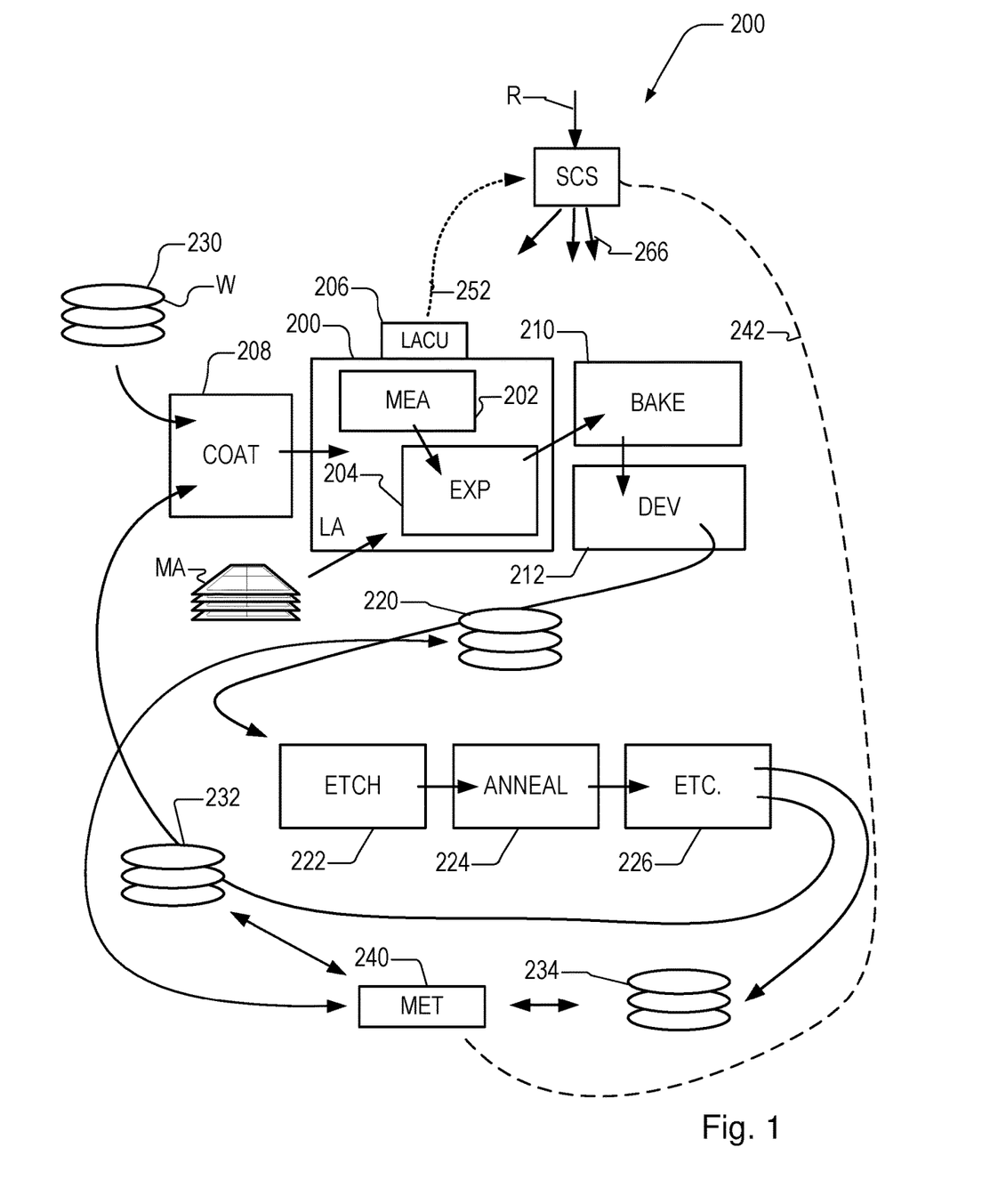
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

Figure 2:
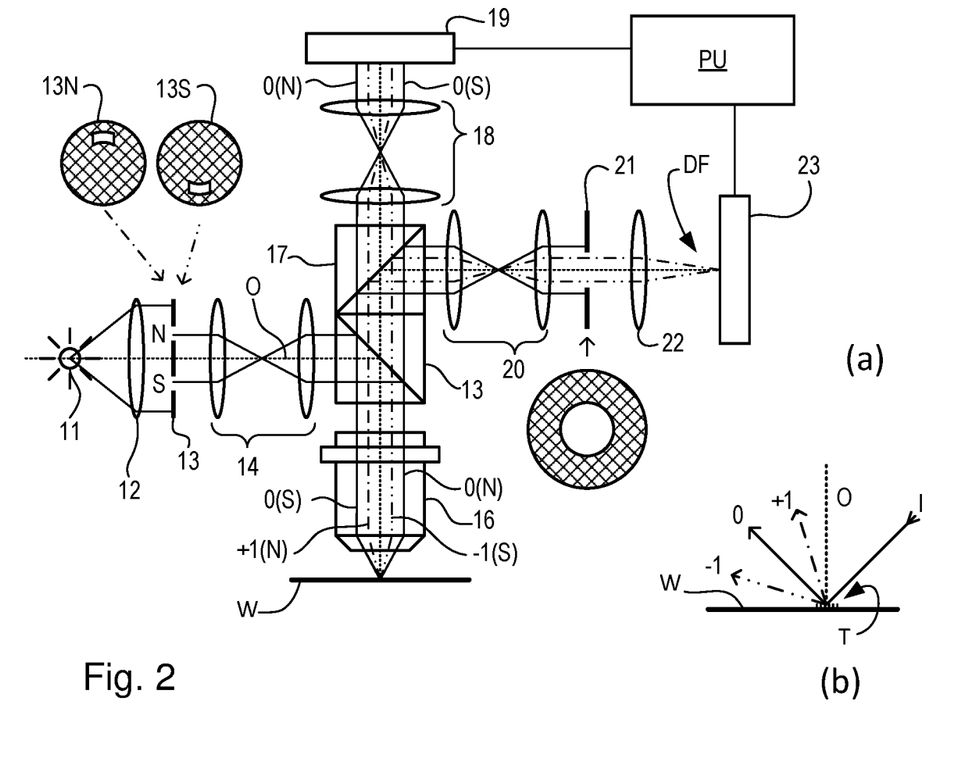
FIG. 2 comprises a schematic diagram of a scatterometer for use in measuring targets according to embodiments of the invention.

A metrology apparatus suitable for use in embodiments of the invention is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2 are purely examples. In another embodiment of the invention, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameters under which a pattern will be produced within specification). Examples of pattern specifications that relate to a potential systematic defect include checks for necking, line pull back, line thinning, CD, edge placement, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hot spots" or "process window limiting patterns (PWLPs)," which are used interchangeably herein. When controlling a lithography process, it is possible, and typically economical, to focus on the hot spots. When the hot spots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW).

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas will typically be formed using the same focus (or dose or position etc.) setting due to control grid resolution limitations.

Figure 3:
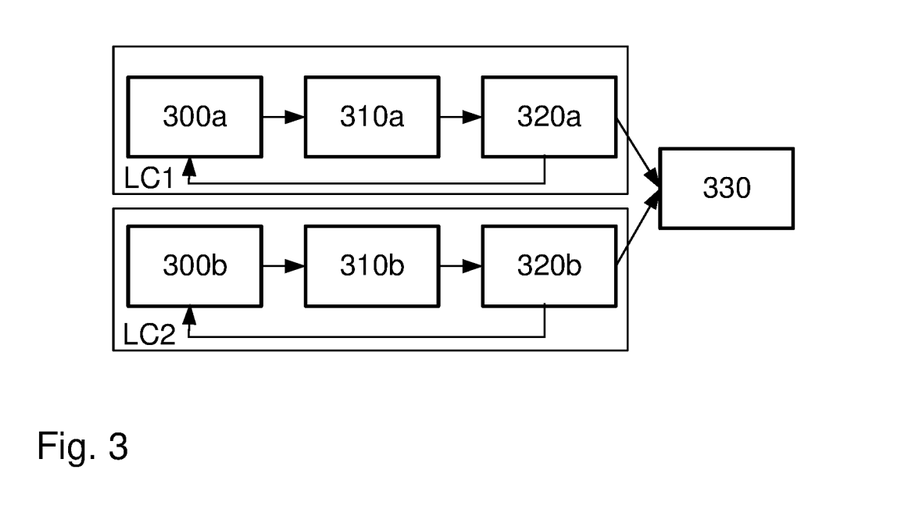
FIG. 3 is a flow diagram describing a present method of manufacturing integrated devices which utilizes wafer-to-wafer bonding.

FIG. 3 shows a device manufacturing arrangement for making bonded substrates (and therefore ICs based on bonded substrates) comprising a first manufacturing lithocell LC1 and a second manufacturing lithocell LC2. Within each lithocell is a pair of lithographic processing systems 300a, 300b and first metrology systems 310a, 310b. The lithographic processing system 300a, 300b, may comprise a full patterning system Such a system may comprise, for example, an optical lithographic apparatus or scanner such as described in respect of FIG. 1, a track tool, a deposition tool, an etch tool, any other apparatus used in the patterning process, or any combination selected therefrom. The systems may also each comprise a software application 320a, 320b in communication with its respective lithographic processing system 300a, 300b and metrology system 310a, 310b, so that results, designs, data, etc. of the lithographic processing system 300a, 300b and/or the metrology apparatus 310a, 310b may be stored and analyzed by the software application 320a, 320b at the same time or different times.

Once pairs of substrates or wafers are completed from each of lithocell LC1 and lithocell LC2, they may be bonded within a bonding tool 330 to obtain a bonded wafer. Bonding in this context is wafer-to-wafer bonding where whole wafers are aligned and bonded together such that individual dies on each wafer are aligned. The concept of wafer-to-wafer bonding is known and used in many IC manufacturing processes. The bonding tool 330 may comprise a bonding alignment device for aligning the wafers together for bonding. For example, the bonding tool 330 may perform pre-align using box-in-box marks provided to wafers (e.g., one box on each wafer), with visual inspection of marks used for alignment quality/position control. Another method uses two imaging sensors (e.g., face to face) which are first calibrated together to find their relative positions; each sensor is then used to separately align a respective wafer to be bonded.

Lithocell LC1 and lithocell LC2 may be the same lithocell, different lithocells but comprising one or more shared tools and elements, or be completely different lithocells having completely different sets of apparatuses and tools, possibly even at different sites or fabs. For example, one or more of the tools or apparatuses of the lithographic processing systems 300a and 300b may comprise different tools or the same tools within each respective system. Similarly metrology apparatuses 310 and 310b may be the same apparatus or different apparatuses. The software application 320a, 320b may be comprised within one or both of the respective lithographic processing systems 300a, 300b and/or one or both of the first metrology systems 310a, 310b, or elsewhere.

Once bonded, the bonded wafer may be subject to further lithographic patterning and processing. As such, alignment will be performed on the bonded wafer; e.g., for aligning the substrate and determining feed-forward corrections based on measured grid deformities. Also post-exposure metrology, such as overlay metrology, may be performed on the bonded wafer after exposure; e.g., to determine feedback corrections for subsequent wafers.

Conventional wafer fab processes (e.g., for non-bonded wafers) typically suffer from wafer-to-wafer non-uniformities which are most prominent at the wafer edge, and which are typically corrected for by using an alignment model. Wafer-to-wafer bonding is a relatively new wafer fab process which leads to previously unknown fingerprint types which are dominant in the wafer center. This is due to the bonding stamp of the bonding tool initiating wafer bonding at wafer center, from where the bonding front travels toward the edge.

Most existing alignment models and alignment strategies do not capture center wafer fingerprints well. Alignment models commonly used are polynomial models with have zero effect in the origin (center wafer). Also the alignment mark and/or overlay target layout may not be well matched with the center of the wafer, and therefore liable to miss correctable fingerprint content.

Therefore, an improved alignment strategy is proposed which better captures specific center wafer fingerprints caused by the wafer-to-wafer bonding process.

Figure 4:
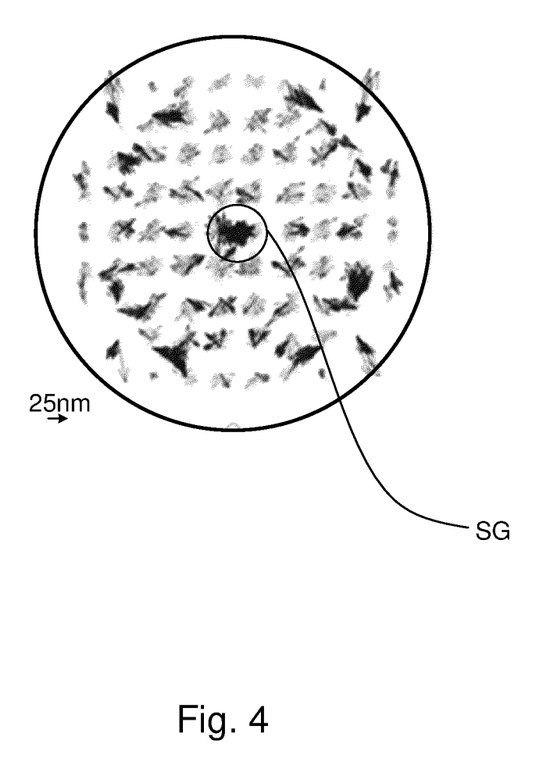
FIG. 4 is a vector plot of overlay or deformation error on a bonded substrate.

FIG. 4 illustrates the problem of a wafer center singularity which is induced by the bonding tool and substrate thinning process. FIG. 4 is an overlay vector plot of a post-bonded wafer with darker shading indicating a larger overlay error (or grid deformation error). The singularity Sg (circled) is the area of large overlay error at or near the wafer center. In this plot there are other areas and points which also have large overlay vectors; however, the central area is very hard or impossible to correct for using currently available alignment or overlay correction schemes.

Typically the wafer sampling used to collect overlay or alignment data is of similar sparsity as shown in FIG. 4. This sampling fails to properly locate and resolve the large excursion at the wafer center. This can be solved to a limited extent by adjusting the sampling layout. However, the constraint limiting this approach is that overlay marks are usually placed in the scribe-lane present around individual dies/chips. This already limits resolution.

Another aspect is correctability once the metrology data has been obtained. Typical alignment overlay correction models are polynomial based aiming at correcting slowly varying fingerprints across wafer, and also intrafield. Singularities such as shown in FIG. 4 requires a separate approach with a scheme targeting a distinct correction of the singularity, possible in combination with the present approach.

Therefore, a method is proposed which comprises adjusting, matching and/or shifting an alignment or overlay sampling scheme physically on the wafer with respect to a singularity defined by large overlay error at a central region of a bonded wafer, so as to capture the center wafer fingerprint. Such a method may comprise determining a location of the singularity and optimizing the sampling scheme based on this determination.

The method may further comprise altering the alignment model in a location-dependent fashion (e.g., by regularization) for this singularity. The alignment model may comprise a local model, such as an existing zone alignment or radial basis functions (RBF) spline model, with a radius- or location-dependent regularization. Zone alignment is described for example in Huang et al, "Overlay improvement by zone alignment strategy," Proc. SPIE 6922, 69221G (2008). RBF modeling is described in US2012218533A1. Both of these documents are incorporated herein by reference. RBF modeling essentially comprises an interpolation method, e.g., based on radial-based thin plate splines. Thin plate spline (TPS) refers to a physical analogy involving the bending of a thin sheet of metal. In the physical setting, the deflection is in the z direction, orthogonal to the plane of the thin sheet. In order to apply this idea to the problem of substrate deformation in a lithographic process, the lifting of the plate can be interpreted as a displacement of the x or y coordinates within the plane.

In addition, alignment signals after the wafer bonding step can be noisy due to the bonding process processes. To improve robustness further than present regularization methods, the abovementioned local model can also use noise suppression methods based on machine learning, such as support vector machines (SVM) method. The SVM regression method works by essentially sacrificing/compromising where an error value is small (e.g., within a threshold $\epsilon$), and using that freedom to correct dies with larger errors (e.g., which would otherwise be almost yielding dies). More specifically, the SVM regression method attempts to find a function $f(x)$ that has at most $\epsilon$ deviation from known values (e.g., training data) for all of the training data, and at the same time is as flat (non-complex) as possible. In other words, errors are accepted and ignored provided they are less than $\epsilon$. Deviations larger than this are not tolerated in the basic SVM regression; however, in practical circumstances the resultant optimization problem will typically not be feasible. To address this, slack variables $\xi_i, \xi^*_i$ may be used to accommodate outliers.

Alternatively, or in addition the wafer center spot may be captured more densely using artificial alignment data generation techniques such as using leveling data in combination with a flatness to overlay conversion model. Such a conversion model may be used in computational metrology methods for predicting overlay or other substrate plane grid data based on level sensor data (measurements perpendicular to the substrate plane).

It is proposed that the alignment or overlay sampling scheme is adjusted without increasing the metrology effort (or not significantly, e.g., with no more than 10% or no more than 20% increase in measurement locations).

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for optimizing a sampling scheme which defines sampling locations on a bonded substrate, having undergone a wafer to wafer bonding process, the method comprising:
   determining a sampling scheme for a metrology process; and
   optimizing, by a hardware computer system, the sampling scheme with respect to a singularity defined by a large overlay error and/or grid deformation at a central location on the bonded substrate to obtain a modified sampling scheme.

2. The method as claimed in claim 1, further comprising determining a location of the singularity and optimizing the sampling scheme based on this determination.

3. The method as claimed in claim 1, wherein the optimizing the sampling scheme comprises adjusting, matching and/or shifting the sampling scheme with respect to the singularity.

4. The method as claimed in claim 1, further comprising performing the metrology process in accordance with the modified sampling scheme to obtain metrology data.

5. The method as claimed in claim 4, wherein the metrology process is a post-exposure overlay metrology process.

6. The method as claimed in claim 4, wherein the metrology process is an alignment process.

7. The method as claimed in claim 6, further comprising altering an alignment model for this singularity in dependence of location, the alignment model used to define a substrate grid for the bonded substrate.

8. The method as claimed in claim 7, wherein the alignment model comprises a local model with a radius-dependent and/or location-dependent regularization.

9. The method as claimed in claim 8, wherein the local model comprises a zone alignment model or a radial basis functions spline model.

10. The method as claimed in claim 7, wherein the alignment model uses a machine learning noise suppression method.

11. The method as claimed in claim 10, wherein the noise suppression method comprises a support vector machines method.

12. The method as claimed in claim 4, further comprising generating additional metrology data using leveling data in combination with a conversion model which generates substrate plane grid data based on levelling data.

13. A lithographic apparatus which is configured to provide product structures to a bonded substrate, having undergone a wafer to wafer bonding process, in a lithographic process, the lithographic apparatus comprising a processor configured to optimize control of the lithographic apparatus during a manufacturing process by performing the method of claim 1.

14. A metrology device configured to perform the method of claim 4.

15. A non-transient computer program carrier comprising a computer program therein, the computer program, upon execution by a computer system, configured to cause the computer system to at least:
  determine a sampling scheme for a metrology process; and
  optimize the sampling scheme which defines sampling locations on a bonded substrate having undergone a wafer to wafer bonding process, with respect to a singularity defined by a large overlay error and/or grid deformation at a central location on the bonded substrate to obtain a modified sampling scheme.

16. The carrier as claimed in claim 15, wherein the instructions are further configured to cause the computer system to determine a location of the singularity and optimize the sampling scheme based on this determination.

17. The carrier as claimed in claim 15, wherein the instructions configured to cause the computer system to optimize the sampling scheme are further configured to cause the computer system to adjust, match and/or shift the sampling scheme with respect to the singularity.

18. The carrier as claimed in claim 15, wherein the instructions are further configured to cause the computer system to cause performance of the metrology process in accordance with the modified sampling scheme to obtain metrology data.

19. The carrier as claimed in claim 15, wherein the metrology process is an alignment process.

20. The carrier as claimed in claim 19, wherein the instructions are further configured to cause the computer system to alter an alignment model for this singularity in dependence of location, the alignment model used to define a substrate grid for the bonded substrate.

* * * * *